United States Patent [19]

Son et al.

[11] Patent Number: 5,204,838
[45] Date of Patent: Apr. 20, 1993

[54] HIGH SPEED READOUT CIRCUIT

[75] Inventors: Jinshu Son; Nobuaki Miyakawa, both of Kanagawa, Japan

[73] Assignee: Fuji Xerox Co., Ltd., Tokyo, Japan

[21] Appl. No.: 751,618

[22] Filed: Aug. 21, 1991

Related U.S. Application Data

[63] Continuation of Ser. No. 426,545, Oct. 26, 1989, abandoned.

[30] Foreign Application Priority Data

Oct. 28, 1988 [JP] Japan ............... 63-270792

[51] Int. Cl.$^5$ .............. G11C 7/00; G11C 7/02; G01R 19/00; H03F 3/45
[52] U.S. Cl. .............. 365/203; 365/189.01; 365/189.05; 365/205; 365/206; 307/530
[58] Field of Search ............... 365/205, 206, 207, 208, 365/104, 203, 189.01, 189.05; 307/530, 468, 482

[56] References Cited

U.S. PATENT DOCUMENTS

| | | | |
|---|---|---|---|
| 4,584,672 | 4/1986 | Schutz et al. | 365/104 |
| 4,709,352 | 11/1987 | Kitazawa | 365/104 |
| 4,821,239 | 4/1989 | Lev | 365/205 |
| 4,831,593 | 5/1989 | Kubota et al. | 365/104 |
| 4,859,882 | 8/1989 | Matsumoto et al. | 365/104 |

FOREIGN PATENT DOCUMENTS 59-24493 2/1984 Japan .

Primary Examiner—Joseph L. Dixon
Assistant Examiner—Michael A. Whitfield
Attorney, Agent, or Firm—Finnegan, Henderson, Farabow, Garrett and Dunner

[57] ABSTRACT

The high speed readout circuit has an amplifier unit and an operating point setting unit and reads data from a memory sense line at high speed. The circuit further includes a unit for setting an operating point of the amplifier unit by short-circuiting the input and output terminals of the amplifier in response to a first control signal and precharging the sense line up to the operating point, and a unit for setting the sense line at a voltage slightly deviating the operating point in response to a second control signal by making use of a Miller capacitance and sensing the variations from the preset voltage during a reading process.

5 Claims, 4 Drawing Sheets

HIGH SPEED READOUT CIRCUIT

This application is a continuation of application Ser. No. 07/426,545 filed Oct. 26, 1989 now abandoned.

BACKGROUND OF THE INVENTION

1. Field of the Invention

The present invention is related to a method of reading data at a high speed by detecting variations in voltage of a sense line during readout of data from a memory in which write data are, as in the case of a ROM and a microcode, previously determined.

2. Description of the Prior Art

A typical arrangement of a conventional memory data readout control circuit is depicted in FIG. 1.

A ROM circuit 1 is composed of a sense line electrifying charging unit 2, a sense line control unit 6, a sense line 13 and a sense amplifier 14. The numeral 10 represents a capacitance of the sense line. Before the memory data are read out, a control signal 5 becomes active, while sense line 13 is charged to a power supply voltage from power supply terminal 3 of sense line charging unit 2 via MOS transistor 4 or at a potential which drops due to fundamental device characteristics (e.g., a substrate effect) of a MOS transistor.

Subsequently, when a control signal 9 transmitted from an address decoder 11 becomes active, sense line 13 is discharged to an earth voltage via action of an NMOS transistor 8 of readout control unit 6. Whereas if control signal 9 does not become active, sense line 13 is kept at an elevated voltage, because NMOS transistor 8 remains OFF.

When data is read from ROM circuit 1, a control signal 15 becomes active, and any voltage on sense line 13 is detected by sense amplifier 14. Then, a readout result is output from output terminal 18. For instance, where sense line 13 has been discharged to ground or zero voltage, a logic value of 0 is read out. When sense line 13 is charged at the elevated voltage, a logic value 1 is read out.

This type of device is exemplified in Japanese Patent Laid-Open Publication No. 59-24493.

Although suitable for the purposes intended, the following disadvantages are inherent in the conventional construction when reading out the data from the memory. For example, as the size of the memory increases, the length of each line increases. The increase in length of the sense line causes a corresponding increase in capacitance of the sense line. Capacitance in the sense line increases the time it takes to read out data from the memory, because the MOS transistor controlling the sense line is relatively small in configuration but has a large turn on resistance. Also, an increase in speed of a memory read operation can be achieved by using a sense amplifier circuit (e.g., a sense amplifier using a differential amplifier circuit) but the structure becomes complicated. Moreover, a sense amplifier circuit has to be used for every bit so large chip area is required.

SUMMARY OF THE INVENTION

The present invention overcomes the problems and disadvantages of the prior art by providing a high speed readout circuit which performs a read operation at an increased speed and has a simple construction with high sensitivity.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, a high speed readout circuit for reading out data transferred via a sense line of a memory unit comprises an amplifier unit having an input terminal and an output terminal for detecting variations from a preset voltage on a sense line so as to read out stored data; an operating point setting unit for setting an operating point of the amplifier by short-circuiting the input and output terminals of the amplifier unit and for precharging said sense line to the operating point in response to a first signal; and means including a capacitor and a Miller capacity for setting the voltage on the sense line to a value having a predetermined increment of deviation from said operating point in response to a second signal, for speed up and sensing the variations from the preset voltage on the sense line during the reading out of data.

According to one aspect of the invention, there is provided a high speed readout circuit including an amplifier unit for detecting variations from a preset voltage on a sense line so as to read out a storage content, and an operating point setting unit for setting an operating point of the amplifier unit, characterized by comprising a means for setting the operating point of the amplifier unit by short-circuiting an I/O of the amplifier unit in response to a first signal and at the time precharging the sense line up to the operating point, and a means for setting the sense line at a voltage in the vicinity of the operating point to deviate slightly from this operating point in response to a second signal by utilizing a capacitor and a Miller capacity to attain a further speedup and sensing the variations from the preset voltage on the sense line during a reading process.

A memory sense line electrifying unit is required in the art. Based on the high speed circuity of the invention, both a precharge function and a sense function of the sense line can be provided on the basis of the same construction, whereby the memory can be read at a high velocity with a simple structure.

The accompanying drawings, which are incorporated in and constitute a part of this specification, illustrate one embodiment of the invention and, together with the description, serve to explain the principles of the invention.

BRIEF DESCRIPTION OF THE DRAWINGS

Other objects and advantages of the present invention will become apparent during the following discussion taken in conjunction with the accompanying drawings, in which.

DETAILED DESCRIPTION OF THE PREFERRED EMBODIMENTS

Reference will now be made in detail to the present preferred embodiment of the invention, an example of which is illustrated in the accompanying drawings.

Figure 2:
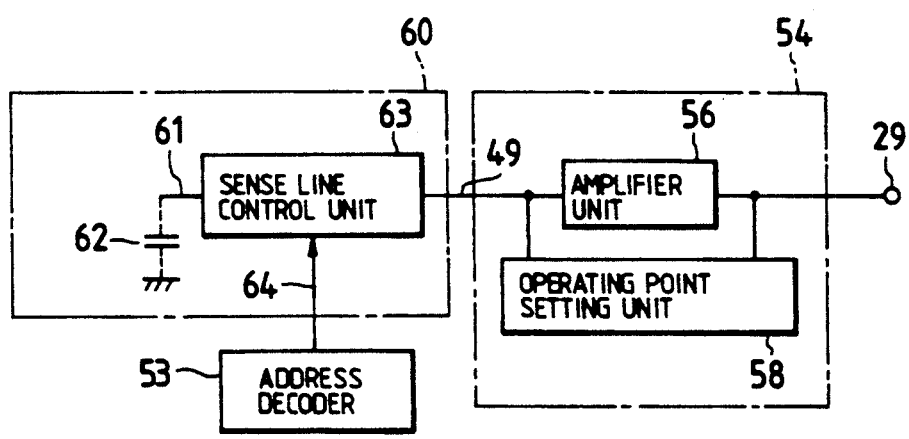
FIG. 2 is a block diagram depicting a memory readout circuit using a high speed readout circuit according to the present invention.

Referring to FIG. 2, a memory readout circuit employing a high speed readout circuit 54 for reading data from memory 60 according to the present invention is illustrated. High speed readout circuit 54 is composed of an amplifier unit 56 and an operating point setting unit 58. A memory sense line 61 is precharged by amplifier unit 56. A precharge voltage of memory sense line 61 is set at a voltage in the vicinity of the operating point of amplifier unit 56 so the precharge deviates slightly from the operating point. The precharge voltage is arranged to secure a high gain because of its being in the vicinity of the operating point.

Figure 1:
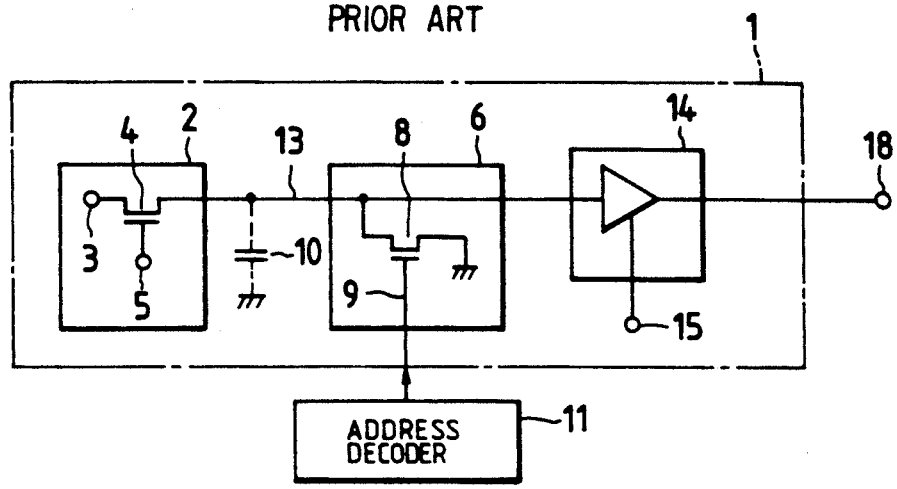
FIG. 1 is a block diagram illustrating a conventional memory data readout control circuit.

Amplifier unit 56 is capable of high speed detection of minute variations in voltage of sense line 61 during memory reads. Sense line 61 has a sense line capacitance 62 which is similar to sense line capacitance 10 of sense line 13 in FIG. 1. In accordance with a control signal 64 transmitted from an address decoder 53 to sense line control unit 63, if the memory sense line 61 is not discharged to an earth voltage, a normal operation can be held by setting the precharge voltage at a voltage at which a logic value 1 is read out in the vicinity of the operating point. When memory sense line 61 is discharged to the earth voltage in response to control signal 64, a logic value 0 is read out.

Figure 3:
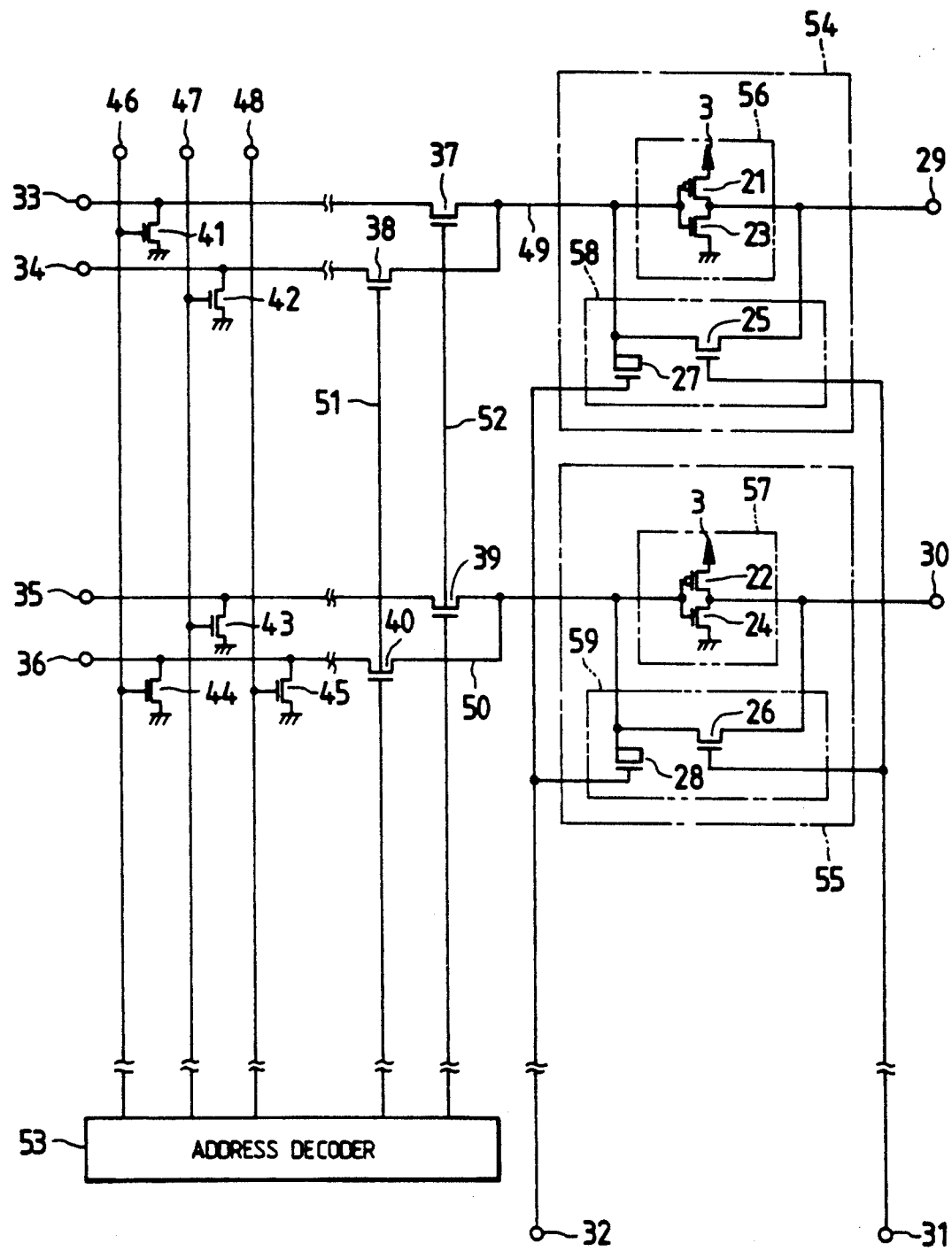
FIG. 3 is a circuit diagram showing an embodiment of a memory readout circuit employing a high speed readout circuit according to a first preferred embodiment of the invention.

FIG. 3 illustrates an embodiment of a memory readout circuit according to the present invention which employs high speed readout circuit 54.

A high speed readout circuit 54, according to the present invention, includes an amplifier unit 56 and an operating point setting unit 58. Amplifier unit 56 shown in FIG. 3 includes high gain inverter circuitry composed of a PMOS transistor 21 and an NMOS transistor 23. Operating point setting unit 58 includes NMOS transistors 25 and 27. NMOS transistor 25 is intended to set an operating point of the high gain inverter circuitry of amplifier unit 56 to obtain a high gain by short-circuiting the input and output of the inverter circuitry.

NMOS transistor 27 sets sense lines 33 or 34 at a voltage deviating slightly from the operating point in order to aid in increasing the speed of operation of the invention. NMOS transistors 25 and 27 are driven by clocks 31 and 32 respectively, which are not overlapped with each other. The numerals 49 and 29 denote an input and an outputs respectively, of high speed readout circuit 54.

The numeral 55 represents another set of high speed readout circuit. High speed readout circuit 55 has the same structures high speed readout circuit 54. That is, high speed, readout circuit 55 includes an amplifier unit 57 and operating point setting unit 59. Amplifier unit 57 includes a PMOS transistor 22 and a NMOS transistor 24. Operating point setting unit 59 includes NMOS transistors 26 and 28.

An address decoder 53 outputs control signals 46, 47 and 48 for discharging sense lines 33, 34, 35 and 36 to earth or ground voltage. Sense line pair 33 and 34 are connected to high speed readout circuit 54 and sense line pair 34 and 36 are connected to high speed readout circuit 55. As illustrated in FIG. 3, address decoder 53 outputs control signals 51 and 52 for selecting sense line pairs 34, 36 and 33, 35 respectively.

NMOS transistors 41 through 45 discharge the sense lines to earth or ground voltage. NMOS transistors 37 through 40 selectively connect corresponding, respective sense lines 33 through 36 to high speed readout circuits 54 and 55 of the invention.

In accordance with this embodiment of the present invention, when control signal 52 of address decoder 53 is active, control signal 51 becomes inactive. In this case, NMOS transistors 37 and 39 are turned ON and NMOS transistors 38 and 40 are turned OFF, thereby selecting sense lines 33 and 35. Since NMOS transistors 38 and 40 are turned OFF, sense lines 34 and 36 are not selected. Using such a multiplex circuit, the same high speed readout circuitry in accordance with the invention can be used for several sense lines.

Figure 4:
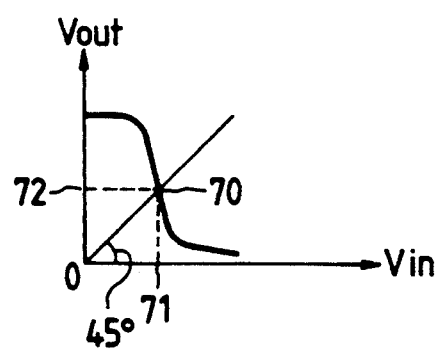
FIG. 4 is a diagram showing a voltage characteristic at the input and the output of the inverter circuitry of FIG. 3.

Amplifier unit 56 which is part of high speed readout circuit 54 includes an inverter. FIG. 4 shows a voltage characteristic of the inverter circuitry in amplifier 56. A line is drawn at an angle of 45° from the origin. A point at which the 45° angle line from the origin intersects an I/O characteristic line of the inverter of amplifier 56 is defined as an inverter operating point 70. The input and output voltage of the inverter circuitry are equalized at operating point 70. Since operating point 70 is positioned at the sharpest gradient of the I/O characteristic line of the inverter, minute variations in input voltage of the inverter are amplified. That is, minute variations of input voltage result in large fluctuations in output of the inverter. The inverter circuitry of amplifier 57 in high speed readout circuit 55 illustrated in FIG. 3 operates in the same manner.

Figure 5:
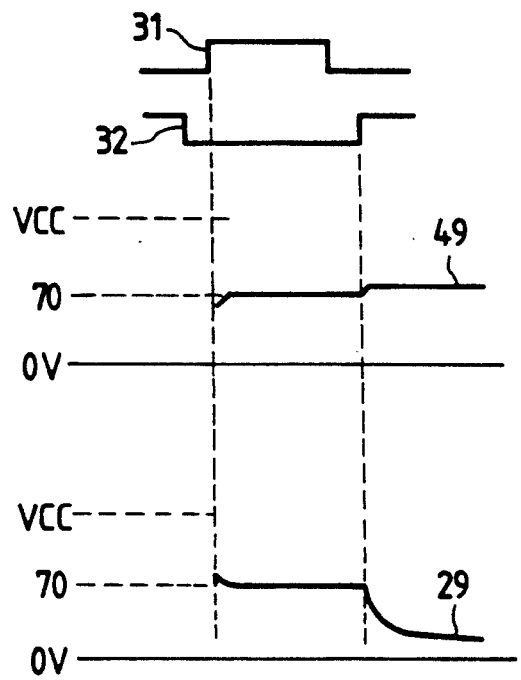
FIG. 5 is a timing chart of voltage waveforms at the input and output of the high speed readout circuit of FIG. 3.

When clock 31 becomes active, NMOS transistor 25 is turned ON. When NMOS transistor 25 is turned on, input 49 and output 29 of amplifier unit 56 of high speed readout circuit 54 are short-circuited, with the result that voltages thereof are equalized and set at operating point voltage 70. In this embodiment, while NMOS transistor 37 is turned ON, sense line 33 is selected. Thus, sense line 33 is precharged up to operating point 70 by amplifier unit 56 through the action of NMOS transistors 25 and 37. The waveforms of voltages at the input and at the output of amplifier unit 56 are illustrated in FIG. 5.

Similarly, when clock 31 is activated, NMOS transistor 26 of amplifier unit 57 is turned ON. According to the present invention, an input 50 and an output 30 of amplifier unit 57 of high speed readout circuit 55 are short-circuited, with the result that the voltages at input 50 and output 30 are equalized and set at the operating point voltage for amplifier unit 57. While the NMOS transistor 39 is turned ON, sense line 35 is selected. Therefore, sense line 35 is precharged up to the operating point of amplifier unit 57 by amplifier unit 57 through NMOS transistors 26 and 39.

Since clocks 31 and 32 do not overlap, when clock 31 becomes inactive, clock 32 is active. In this case, NMOS transistors 25 and 26 are turned OFF and NMOS transistors 27 and 28 are turned ON. When clock 32 is switched from an OFF-state to an ON-state, sense lines 33 and 35 are raised up to voltages which slightly deviate from the operating points of amplifier units 56 and 57 due to a Miller capacitance (an overlapping capacity of the source, drain and gate of an MOS transistor). The voltages of outputs 29 and 30 of high speed readout circuits 54 and 55 are at a low level since NMOS transistors 25 and 26 are turned OFF. This arrangement facilitates high speed read of data from memory. Voltage waveforms of high speed readout circuit output 29 are illustrated in FIG. 5.

Control signals 46 and 47, transmitted from address decoder 53, are synchronized with clock 32. In this embodiment, control signals 46–48 are synchronized with clock 32 so control signal 46 is in an active state and control signals 47 and 48 are in an inactive state when clock 32 is active. In this case, NMOS transistors 41 and 44 are turned ON since control signal 46 is active. As a result, sense lines 33 and 36 are discharged to earth or ground voltage. While control signals 47 and 48 remain inactive, sense lines 34 and 35 remain at a charged or inactive voltage.

If control signal 52 is active, NMOS transistor 37 is turned ON. Accordingly, NMOS transistor 38 is turned OFF since control signal 51 is inactive. Therefore, input 49 of the high speed readout circuit of the invention is discharged to earth ground voltage, and the voltage of high speed readout circuit output 29 is at a high level.

NMOS transistor 39 is turned ON in response to active control signal 52 and NMOS transistor 40 is turned OFF in response to inactive control signal 51. Thus, input 50 of high speed readout circuit 55 is kept at a voltage slightly higher than the charge or active voltage, and the voltage of high speed readout circuit output 30 is at a low level.

Figure 6:
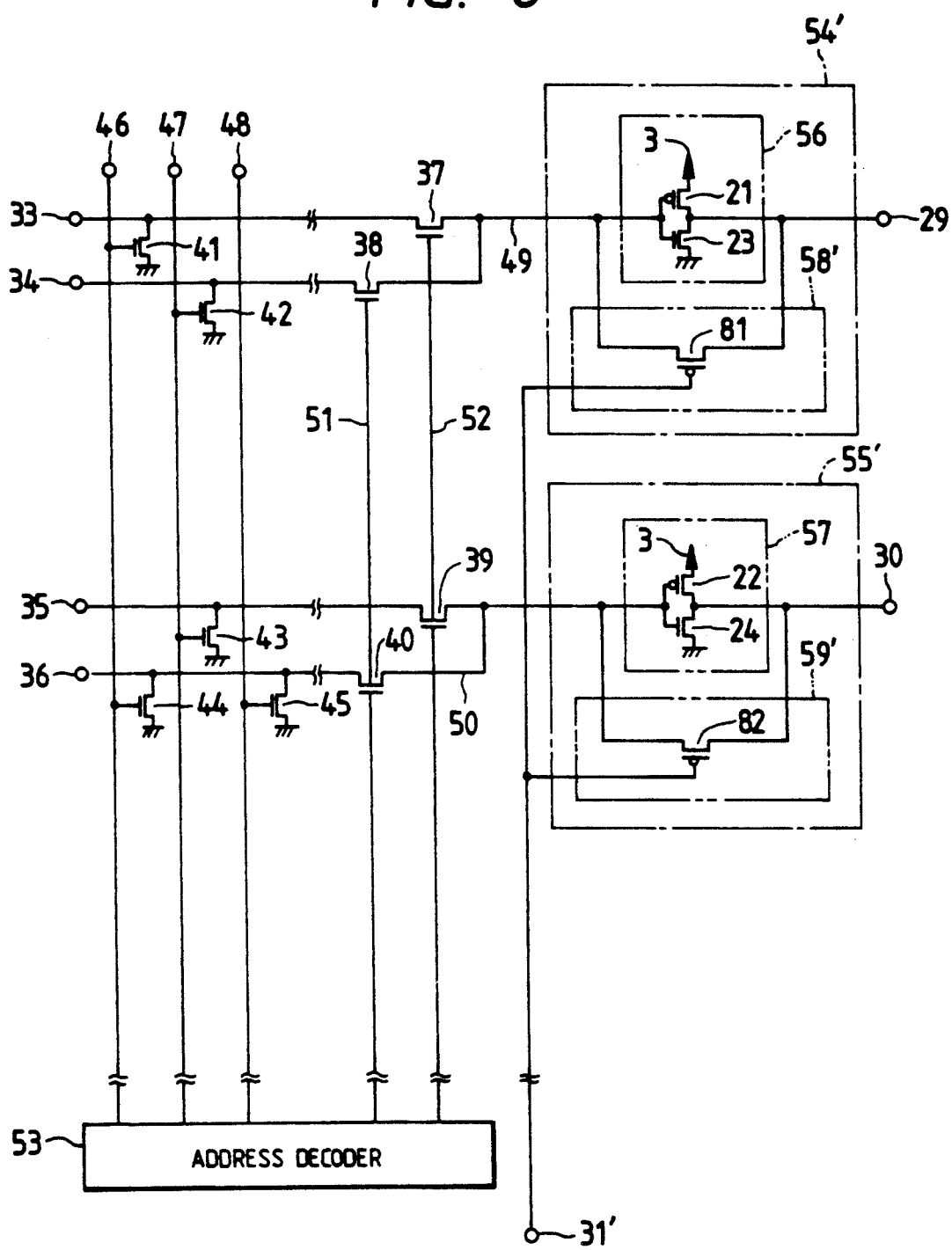
FIG. 6 is a circuit diagram depicting a memory readout circuit according to a second preferred embodiment of the invention.

A second embodiment of the present invention is illustrated in FIG. 6. The embodiment of FIG. 6 differs from the embodiment of FIG. 3 in that NMOS transistors 27 and 28 of FIG. 3 are omitted. Additionally, clock 32 for driving NMOS transistors 27 and 28 in the first embodiment is eliminated. NMOS transistors 25 and 26 of the first embodiment are replaced with PMOS transistors 81 and 82 shown in FIG. 6. Clock 31 for driving NMOS transistors 25 and 26 is replaced with clock 31' for driving PMOS transistors 81 and 82.

If the capacitance of the memory sense line is small, the memory can be read at a high speed by using a high speed readout circuit including, as in the case of the second embodiment of the invention, an inverter serving as amplifier unit 56 or 57 and PMOS transistor 81 or 82 for short-circuiting input 49 or 50 and output 29 or 30, respectively of the inverter circuitry of amplifier units 56 or 57.

When the voltage of 31' is at a low level, PMOS transistor 81 is turned ON, input 49 and output 29 of amplifier unit 56 are short-circuited. High speed readout circuit input 49 is set at the operating point of amplifier 56 when PMOS transistor is turned ON.

Figure 7:
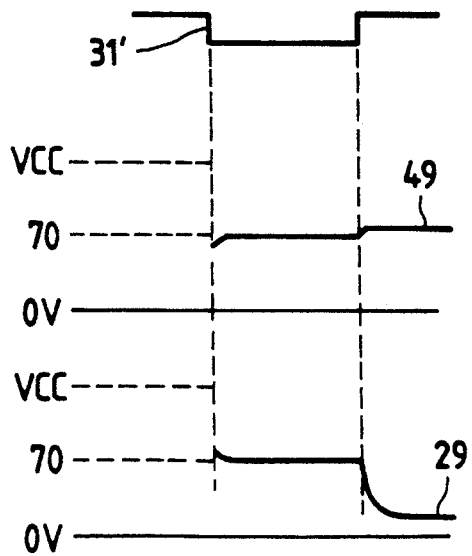
FIG. 7 is a timing chart illustrating the variation in voltage at an input and an output of the high speed readout circuit of the second embodiment of the invention.

When the clock 31' is switched from low level to a high level, high speed readout circuit input 49 is increased to a value slightly higher than the operating point of amplifier unit 56 due to the Miller capacitance of PMOS transistor 81. Accordingly, the voltage of high speed readout circuit output 29 goes to a low level. Waveforms of the high speed readout circuit output 29 and input 49 are illustrated in FIG. 7.

The voltage of high speed readout circuit input 50 is likewise raised up to a voltage slightly higher than the operating point of the amplifier unit 57, and the voltage of high speed readout circuit output 30 goes to a low level.

Sense lines 33–36 are selected in accordance with the control signals 51 and 52 sent from address decoder 53. Sense lines 33, 34, 35 and 36 are discharged to the earth or ground voltage or kept at the fully charged voltage depending on control signals 46, 47 and 48. If sense lines 33, 34, 35 or 36 are discharged to earth voltage, the voltage of corresponding high speed readout circuit input 49 or 50 goes to earth voltage, and the voltage of corresponding high speed readout circuit output 29 or 30 respectively is set to a high level. If sense lines 33, 34, 35 or 36 are kept at the fully charged voltage, the voltage of corresponding high speed readout circuit input 49 or 50 set at the fully charged voltage, and corresponding high speed readout circuit output 29 or 30, respectively, is set at a high level. If the voltage of sense lines 33, 34, 35 and 36 are kept at the fully charged voltage, the voltage of high speed corresponding readout circuit input 49 or 50 is set at the fully charged voltage, and the voltage of corresponding high speed readout circuit output 29 or 30, respectively, goes to a low level.

As discussed above, a high speed readout circuit according to the present invention requires a small number of devices components. The precharge function and the sense function of the sense line are provided by use of the same amplifying unit and operating setting unit. With this arrangement, a memory readout can be attained at a high speed with a simple construction and a high sensitivity.

Although the illustrative embodiments of the present invention have been described in detail with reference to the accompanying drawings, it is to be understood that the invention is not limited to those precise embodiments. Various changes or modifications may be made to the present invention by one skilled in the art without departing from the scope or spirit of the invention. Thus, it is intended that the present invention cover the modifications and variations of this invention provided they come within the scope of the appended claims and their equivalents.

What is claimed is:

1. A high speed readout circuit for reading out data of a memory unit, comprising:
   an amplifier unit having an input terminal and an output terminal for sensing variations from a preset voltage on a sense line so as to read out stored data; and
   an operating point setting unit for setting an operating point of said amplifier by short-circuiting the input and output terminals of said amplifier unit and for precharging said sense line to said operating point in response to a first signal, said operating point setting unit including capacitor means for setting the voltage on said sense line to a value having a predetermined slight deviation from said operating point in response to a second signal.

2. A high speed readout circuit according to claim 1 wherein said amplifier unit includes an inverter circuit.

3. A high speed readout circuit according to claim 2 wherein said inverter circuit includes two metal oxide semiconductor transistors connected in series.

4. A high speed readout circuit according to claim 1 wherein said operating point setting unit includes a metal-oxide semiconductor transistor coupled to said input and output terminals of said amplifier unit.

5. A high speed readout circuit according to claim 4 wherein said capacitor means includes the capacitance of said metal oxide semiconductor transistor of said operating point setting unit.

* * * * *